United States Patent
Wang

(10) Patent No.: US 7,005,956 B2
(45) Date of Patent: Feb. 28, 2006

(54) BALUN BUILT IN MULTIPLE CERAMIC LAYERS

(75) Inventor: Hsing-Sen Wang, Taoyuan (TW)

(73) Assignee: Delta Electronics, Inc., Taoyuan (TW)

(*) Notice: Subject to any disclaimer, the term of this patent is extended or adjusted under 35 U.S.C. 154(b) by 182 days.

(21) Appl. No.: 10/745,037

(22) Filed: Dec. 23, 2003

(65) Prior Publication Data

US 2005/0083162 A1    Apr. 21, 2005

(30) Foreign Application Priority Data

Oct. 20, 2003    (TW) .............................. 92129050 A

(51) Int. Cl.
*H01F 5/00* (2006.01)
(52) U.S. Cl. ........................................ 336/200; 333/25
(58) Field of Classification Search ................... 336/83, 336/200, 206–208, 232; 333/25–26, 185
See application file for complete search history.

(56) References Cited

U.S. PATENT DOCUMENTS

| | | | | |
|---|---|---|---|---|
| 5,886,589 A | * | 3/1999 | Mourant ....................... | 333/26 |
| 5,949,299 A | * | 9/1999 | Harada ......................... | 333/25 |
| 6,501,341 B1 | * | 12/2002 | Mashimo ...................... | 331/96 |
| 6,809,581 B1 | * | 10/2004 | Rofougaran et al. ......... | 327/563 |
| 6,873,224 B1 | * | 3/2005 | Chominski ................... | 333/112 |
| 2005/0037800 A1 | * | 2/2005 | Shih .......................... | 455/550.1 |
| 2005/0040910 A1 | * | 2/2005 | Rijks ........................... | 333/25 |

* cited by examiner

*Primary Examiner*—Tuyen T Nguyen
(74) *Attorney, Agent, or Firm*—Pai Patent & Trademark Law Firm; Chao-Chang David Pai

(57) ABSTRACT

A balance-to-unbalance transformer (10), comprising an input terminal (11), a first output terminal (12), a second output terminal (13), a first circuit line comprising at least two capacitors (C1, C2) in parallel with each other and a first inductor L1 in series with the capacitors (C1, C2), wherein one electrode of each of the capacitors (C1, C2) are grounded, and a second circuit line comprising at least two capacitors (C3, C4) in series with each other and a second inductor (L2) in parallel with the capacitors (C3, C4), wherein one end of the second inductor (L2) is grounded. One end of the first circuit line and one end of the second circuit line are connected in parallel with the input terminal (11), and the other ends of the first and second circuit lines are the first and second output terminal, respectively.

7 Claims, 2 Drawing Sheets

US 7,005,956 B2

BALUN BUILT IN MULTIPLE CERAMIC LAYERS

BACKGROUND OF THE INVENTION

1. Field of the Invention

The invention relates to a balance-to-unbalance (Balun) transformer, and, more particularly, to a Balun built in multiple ceramic layers.

2. Description of the Related Art

In terms of the technology of wireless network communication, a balance-to-unbalance (Balun) transformer is a crucial component, which is provided between a balanced circuit and an unbalanced circuit for transforming signals.

Conventionally, the Balun transformer is composed of microstrips or windings. However, if the conventional Balun transformer is used in applications with a radio frequency of several hundreds MHz or several GHz, the size of the Balun transformer and the weight thereof will be too enormous to be practically incorporated in such applications.

Thus, there is a need for a Balun transformer with reduced size and weight.

BRIEF SUMMARY OF THE INVENTION

In view of the above, it is thus an object of the present invention to provide a balance-to-unbalance (Balun) transformer structure. According to a first preferred embodiment of the present invention, the Balun transformer structure comprises an input terminal, a first output terminal, a second output terminal, a first circuit line, which comprises at least two capacitors in parallel with each other and a first inductor in series with the capacitors, wherein one electrode of each of the capacitors are grounded, and a second circuit line, which comprises at least two capacitors in series with each other and a second inductor in parallel with the capacitors, wherein one end of the second inductor is grounded. In more detail, one end of the first circuit line and one end of the second circuit line are connected in parallel with the input terminal, and the other ends of the first and second circuit lines are the first and second output terminals, respectively.

Preferably, the input terminal is provided for inputting an unbalanced signal and each of the first and second output terminals are provided for outputting a balanced signal, and the power of the outputted balanced signal is one half of the power of the inputted unbalanced signal according to the first preferred embodiment of the present invention.

Preferably, the unbalanced signal is a positive quarter-wavelength and the balanced signal is a negative quarter-wavelength according to the first preferred embodiment of the present invention.

Still, it is another object of the present invention to provide a Balun transformer built in multiple ceramic layers. According to a second preferred embodiment of the present invention, the Balun transformer built in multiple ceramic layers comprises an input terminal, a first output terminal, a second output terminal, at least four ceramic layers, wherein all the input terminal and the first and second output terminals are positioned on one outer surface of a laminated structure of the ceramic layers, at least five patterned metal layers provided for a plurality of capacitance electrodes of first to fourth capacitors, a plurality of wiring lines provided for first and second inductors, and a plurality of via holes provided for electrically connecting the capacitance electrodes and the first and second inductors located between respective metal layers, so as to constitute the Balun transformer, wherein the first and second capacitors in parallel with each other are series connected with the first inductor, one electrode of each of the first and second capacitors are grounded, the third and fourth capacitors in series with each other are parallel connected with the second inductor, and one end of the second inductor is grounded. In more detail, one end of the first capacitor and one end of the third capacitor are connected in parallel with the input terminal, and the other ends of the second and fourth capacitors are the first and second output terminals, respectively.

Preferably, the respective dielectric constants of the ceramic layers are within a range of 7 to 8 according to the second preferred embodiment of the present invention.

Preferably, the input terminal is provided for inputting an unbalanced signal and each of the first and second output terminals is provided for outputting a balanced signal, and the power of the outputted balanced signal is one half of the power of the inputted unbalanced signal according to the second preferred embodiment of the present invention.

Preferably, the unbalanced signal is a positive quarter-wavelength and the balanced signal is a negative quarter-wavelength according to the second preferred embodiment of the present invention.

DETAILED DESCRIPTION OF THE PREFERRED EMBODIMENTS

Figure 1:
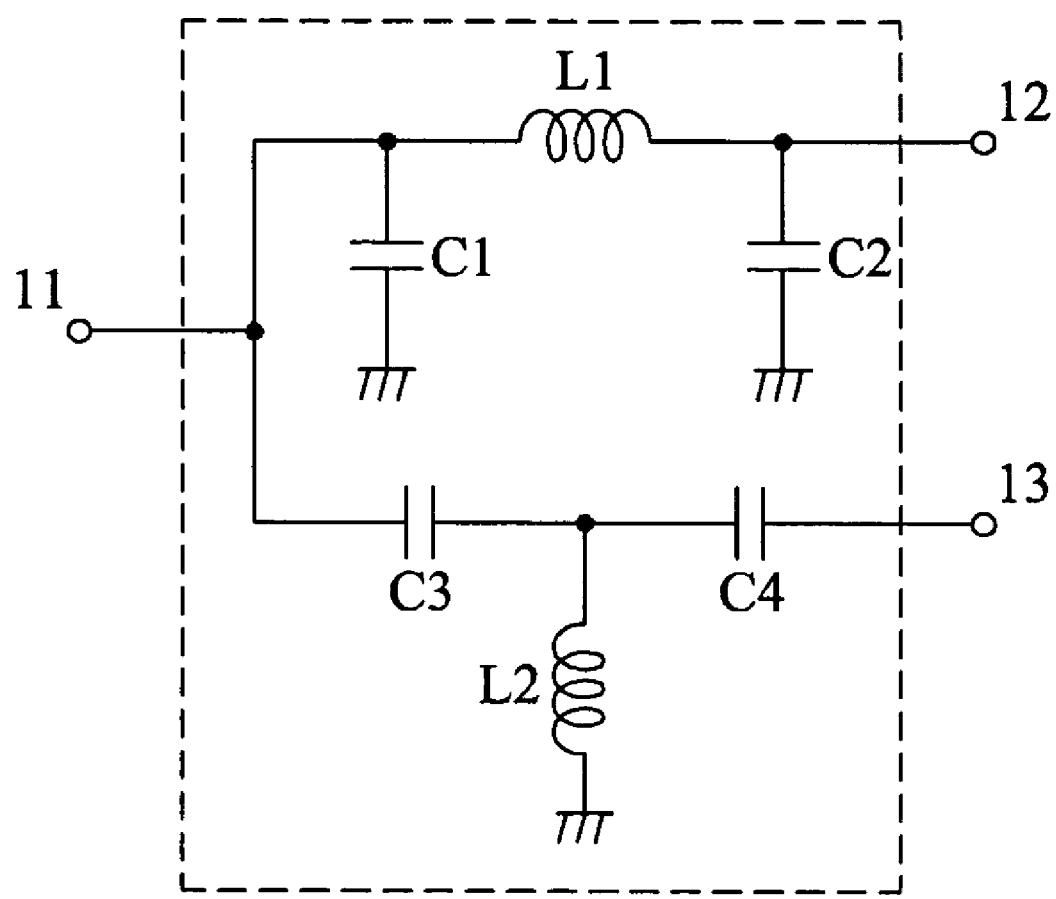
FIG. 1 illustrates a circuit diagram of a Balun transformer according to the first preferred embodiment of the present invention.

Please refer to FIG. 1, illustrating a circuit diagram of a Balun transformer according to the first preferred embodiment of the present invention.

As illustrated in FIG. 1, a Balun transformer structure 10 comprises an input terminal 11, first and second output terminals 12, 13, a first circuit line, which comprises at least two capacitors C1, C2 in parallel with each other and a first inductor L1 in series with the capacitors C1, C2, wherein one electrode of each of the capacitors C1, C2 are grounded, and a second circuit line, which comprises at least two capacitors C3, C4 in series with each other and a second inductor L2 in parallel with the capacitors C3, C4, wherein one end of the second inductor L2 is grounded. Preferably, one end of the first circuit line and one end of the second circuit line are connected in parallel with the input terminal 11, and the other ends of the first and second circuit lines are the first and second output terminals 12, 13, respectively.

It is to be noted that the input terminal 11 is provided for inputting an unbalanced signal and each of the first and second output terminals 12, 13 is provided for outputting a balanced signal, and, preferably, the power of the outputted balanced signal is one half of the power of the inputted unbalanced signal according to the first preferred embodiment of the present invention.

It is preferred that the unbalanced signal is a positive quarter-wavelength and the balanced signal is a negative quarter-wavelength according to the first preferred embodiment of the present invention.

Figure 2A:
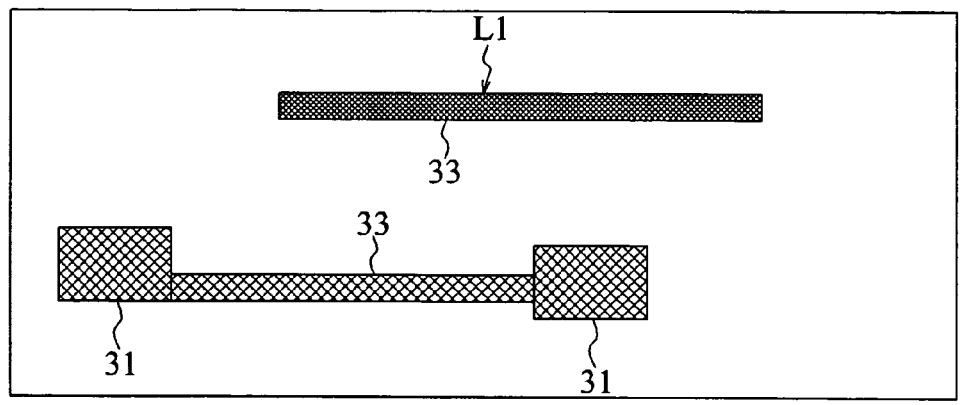
FIGS. 2A and 2B respectively illustrate top and front cross-sectional view of multiple ceramic layers embedded with the Balun transformer according to the second preferred embodiment of the present invention.
Figure 2B:
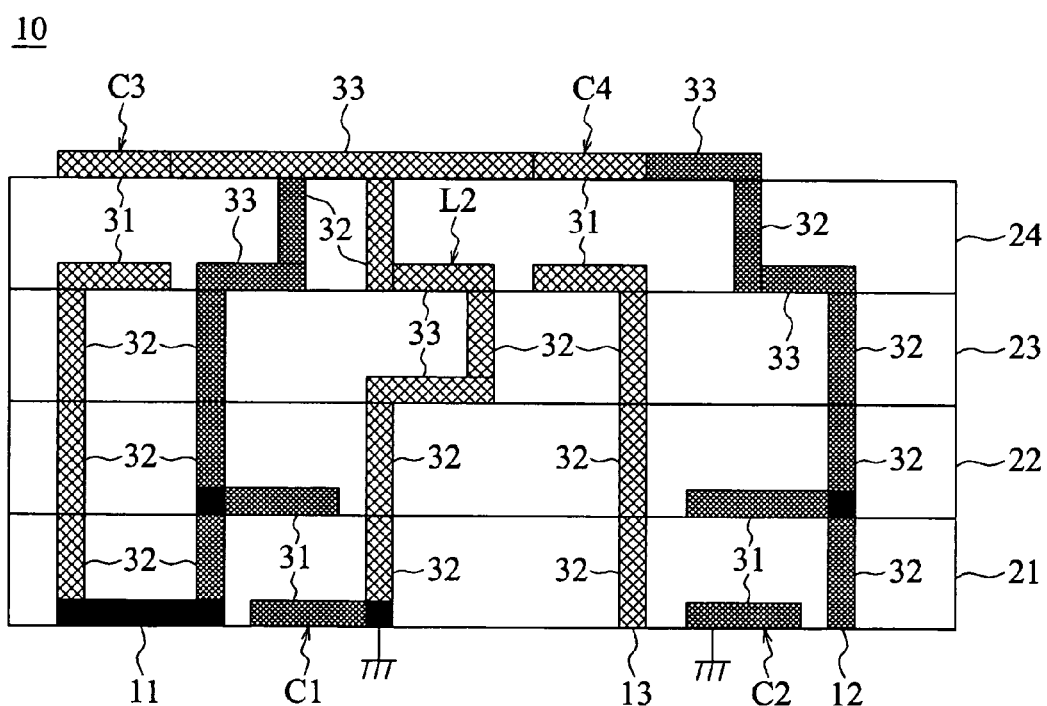

For enabling a reduction in the volume of the Balun transformer 10 according to the first preferred embodiment of the present invention, a Balun transformer 10 built in multiple ceramic layers are illustrated in FIGS. 2A and 2B according to the second preferred embodiment of the present invention.

As illustrated in FIGS. 2A and 2B, the Balun transformer 10 built in multiple ceramic layers comprises an input terminal 11, first and second output terminals 12, 13, at least four ceramic layers 21 to 24, wherein all the input terminal 11 and the first and second output terminals 12, 13 are positioned on one outer surface of a laminated structure of the ceramic layers 21 to 24, at least five patterned metal layers provided for a plurality of capacitance electrodes 31 of first to fourth capacitors C1, C2, C3 and C4, a plurality of wiring lines 33 provided for first and second inductors L1 and L2, and a plurality of via holes 32 provided for electrically connecting the capacitance electrodes 31 and the first and second inductors L1 and L2 located between respective metal layers, so as to constitute the Balun transformer 10.

It is to be noted that the first and second capacitors C1 and C2 in parallel with each other are series connected with the first inductor L1, and one electrode of each of the first and second capacitors C1 and C2 are grounded. In addition, the third and fourth capacitors C3 and C4 in series with each other are parallel connected with the second inductor L2, and one end of the second inductor L2 is grounded. In more detail, one end of the first capacitor C1 and one end of the third capacitor C3 are connected in parallel with the input terminal 11, and the other end of the second and fourth capacitors C2 and C4 are the first and second output terminals 12, 13, respectively.

It is preferred that the respective dielectric constants of the ceramic layers 21 to 24 are within a range of 7 to 8 according to the second preferred embodiment of the present invention.

Similar to the first preferred embodiment, the input terminal 11 is provided for inputting an unbalanced signal and each of the first and second output terminals 12, 13 is provided for outputting a balanced signal, and, preferably, the power of the outputted balanced signal is one half of the power of the inputted unbalanced signal according to the second preferred embodiment of the present invention.

Preferably, the unbalanced signal is a positive quarter-wavelength and the balanced signal is a negative quarter-wavelength according to the first preferred embodiment of the present invention.

Although the foregoing invention has been described in some detail for purposes of clarity of understanding, it is apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A balance-to-unbalance (Balun) transformer structure (10), comprising:
   an input terminal (11);
   a first output terminal (12);
   a second output terminal (13);
   a first circuit line, which comprises at least two capacitors (C1, C2) in parallel with each other and a first inductor L1 in series with the capacitors (C1, C2), wherein one electrode of each of the capacitors (C1, C2) are grounded; and
   a second circuit line, which comprises at least two capacitors (C3, C4) in series with each other and a second inductor (L2) in parallel with the capacitors (C3, C4), wherein one end of the second inductor (L2) is grounded,
   wherein one end of the first circuit line and one end of the second circuit line are connected in parallel with the input terminal (11), and the other ends of the first and second circuit lines are the first and second output terminals, respectively.

2. The balance-to-unbalance (Balun) transformer structure as recited in claim 1, wherein the input terminal is provided for inputting an unbalanced signal and each of the first and second output terminals is provided for outputting a balanced signal, and the power of the outputted balanced signal is one half of the power of the inputted unbalanced signal.

3. The balance-to-unbalance (Balun) transformer structure as recited in claim 2, wherein the unbalanced signal is a positive quarter-wavelength and the balanced signal is a negative quarter-wavelength.

4. A Balun transformer built in multiple ceramic layers, comprising:
   an input terminal;
   a first output terminal;
   a second output terminal;
   at least four ceramic layers, wherein all the input terminal and the first and second output terminals are positioned on one outer surface of a laminated structure of the ceramic layers;
   at least five patterned metal layers provided for a plurality of capacitance electrodes of first to fourth capacitors;
   a plurality of wiring lines provided for first and second inductors; and
   a plurality of via holes provided for electrically connecting the capacitance electrodes and the first and second inductors located between respective metal layers, so as to constitute the Balun transformer,
   wherein the first and second capacitors in parallel with each other are series connected with the first inductor, and one electrode of each of the first and second capacitors are grounded,
   the third and fourth capacitors in series with each other are parallel connected with the second inductor, and one end of the second inductor is grounded, and
   one end of the first capacitor and one end of the third capacitor are connected in parallel with the input terminal, and the other end of the second and fourth capacitors are the first and second output terminals, respectively.

5. The Balun transformer built in multiple ceramic layers as recited in claim 4, wherein the respective dielectric constants of the ceramic layers are within a range of 7 to 8.

6. The Balun transformer built in multiple ceramic layers as recited in claim 4, wherein the input terminal is provided for inputting an unbalanced signal and each of the first and second output terminals is provided for outputting a balanced signal, and the power of the outputted balanced signal is one half of the power of the inputted unbalanced signal.

7. The Balun transformer built in multiple ceramic layers as recited in claim 6, wherein the unbalanced signal is a positive quarter-wavelength and the balanced signal is a negative quarter-wavelength.

* * * * *